United States Patent
Yokoyama et al.

(10) Patent No.: US 7,356,056 B2
(45) Date of Patent: Apr. 8, 2008

(54) COHERENT LIGHT SOURCE AND CONTROL METHOD THEREOF, AND DISPLAY UNIT AND LASER DISPLAY USING THEM

(75) Inventors: Toshifumi Yokoyama, Katano (JP); Kazuhisa Yamamoto, Takatsuki (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 148 days.

(21) Appl. No.: 10/555,500

(22) PCT Filed: Jan. 26, 2005

(86) PCT No.: PCT/JP2005/001009

§ 371 (c)(1),
(2), (4) Date: Nov. 3, 2005

(87) PCT Pub. No.: WO2005/083854

PCT Pub. Date: Sep. 9, 2005

(65) Prior Publication Data

US 2006/0209913 A1 Sep. 21, 2006

(30) Foreign Application Priority Data

Feb. 27, 2004 (JP) .............................. 2004-054096

(51) Int. Cl.
*H01S 3/13* (2006.01)
(52) U.S. Cl. .............................. 372/29.02; 372/29.022; 372/29.023; 372/30
(58) Field of Classification Search ............. 372/29.02, 372/29.021, 29.023, 30
See application file for complete search history.

(56) References Cited

U.S. PATENT DOCUMENTS

| 5,450,428 | A | * | 9/1995 | Maeda ........................ 372/20 |
| 6,195,184 | B1 | * | 2/2001 | Chao et al. .................... 359/32 |
| 6,590,915 | B1 | * | 7/2003 | Kitaoka et al. ........... 372/38.02 |
| 6,594,090 | B2 | | 7/2003 | Kruschwitz et al. |
| 6,738,398 | B2 | * | 5/2004 | Hirata et al. .................. 372/32 |
| 7,010,006 | B2 | * | 3/2006 | Kasazumi et al. ....... 372/29.02 |
| 2001/0005388 | A1 | * | 6/2001 | Hirata et al. .................. 372/22 |

(Continued)

FOREIGN PATENT DOCUMENTS

JP 6-295159 10/1994

(Continued)

OTHER PUBLICATIONS

Chinese Office Action (along with English language translation) issued in Chinese Application No. 20050000221.8 dated Jul. 20, 2007.

Primary Examiner—Minsun Oh Harvey
Assistant Examiner—Yuanda Zhang
(74) Attorney, Agent, or Firm—Wenderoth, Lind & Ponack, L.L.P.

(57) ABSTRACT

In a display device that displays a video by scanning coherent light across a screen, modulation at high speeds and gradation are necessary for a coherent light source.

An oscillation wavelength of a semiconductor laser outputting the fundamental wave is changed at high speeds through the plasma effect induced by applying a pulse current to the coherent light source. A change of the wavelength causes the output of a higher harmonic generated in a light wavelength conversion element to change, and gradation is produced using such a change.

20 Claims, 12 Drawing Sheets

U.S. PATENT DOCUMENTS

2004/0066807 A1* 4/2004 Kasazumi et al. ............ 372/22
2004/0160536 A1* 8/2004 Childers et al. ............ 348/745

FOREIGN PATENT DOCUMENTS

| | | |
|---|---|---|
| JP | 2001-267680 | 9/2001 |
| JP | 2002-43683 | 2/2002 |
| JP | 2002-43698 | 2/2002 |
| JP | 3329446 | 7/2002 |
| JP | 2003-98476 | 4/2003 |
| JP | 2003-298177 | 10/2003 |
| JP | 2004-14647 | 1/2004 |

* cited by examiner

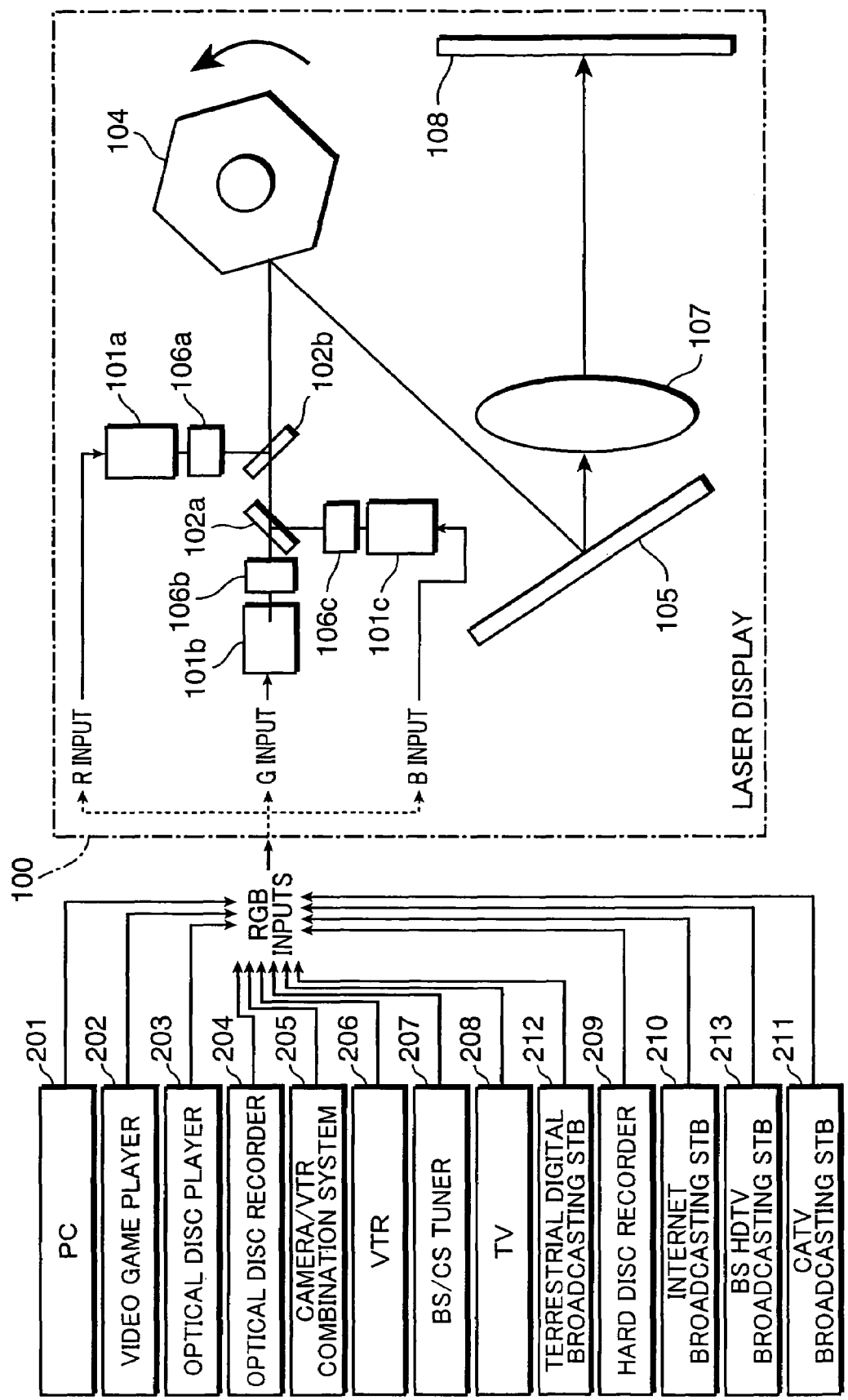

COHERENT LIGHT SOURCE AND CONTROL METHOD THEREOF, AND DISPLAY UNIT AND LASER DISPLAY USING THEM

TECHNICAL FIELD

The present invention relates to a coherent light source using a wavelength conversion element, a control method thereof, and a display device and a laser display using the same.

BACKGROUND ART

FIG. 11 schematically shows the configuration of a laser display 100 as an example of a display device of this kind in the related art. Referring to the drawing, beams of coherent light from laser light sources 101a through 101c of three colors, RGB, undergo intensity modulation, respectively, in light modulators 106a through 106c according to an input video signal, and are then multiplexed on dichroic mirrors 102a and 102b. Further, the light is scanned in the horizontal direction by a polygon scanner (polygon mirror) 104 and in the vertical direction by a galvanometer mirror 105, and a two-dimensional image is displayed on a screen 108.

In the display configured in this manner, because beams of light from the respective RGB light sources are beams of monochromatic light, a displayable color range can be wider than that of an NTSC signal by using laser light sources having adequate wavelengths, which in turn enables a sharp image at high color purity to be displayed.

FIG. 12 shows equipment that can be connected to the laser display in the related art. The laser display in the related art receives a video signal as an input at RGB terminals, and can be connected to equipment having output terminals of RGB signals, including a personal computer 201 such as a notebook-size PC, a video game player 202, an optical disc player 203 for various kinds of DVDs, an optical disc recorder 204 including a disc/VTR combination system, a camera/VTR combination system 205, a stationary VTR 206, a BS/CS tuner 207, a TV set 208, a hard disc recorder 209 including a combination system of a recorder and various kinds of optical disc drives, an Internet broadcasting STB (Set Top Box) 210, a CATV STB 211, a terrestrial digital broadcasting STB 212, a BS HDTV broadcasting STB 213, etc.

In addition, a D4 input terminal, a DVI-D input terminal, an IEEE1394 terminal, a component terminal, an S terminal, a video terminal, etc. may be provided according to the format of a signal outputted from equipment connected to the laser display.

In order to make the display device of this kind easy to carry by reducing the size and power consumption, it is necessary to remove the light modulators 106a through 106c by allowing direct modulation of the laser light sources 101a through 101c. In the configuration in the related art, of the RGB light sources, it is necessary to use a semiconductor laser as the red (R) light source, and SHG light sources as the green (G) and blue (B) light sources. In order to enable a sharp image at high color purity in a displayable color range wider than that of an NTSC signal to be displayed, green light having a wavelength in the vicinity of 530 nm and blue light having a wavelength in the vicinity of 450 nm are required. At the present time, however, because there is no semiconductor laser for green and blue capable of achieving a high output and ensuring the reliability, SHG light sources have to be used. When the use as a light source of the display is considered, not only is it necessary to modulate an output of the SHG light source at high speeds, but it is also necessary to produce gradation in the output. A semiconductor laser for red is able to achieve gradation through modulation at high speeds.

For instance, in a case where two-dimensional scanning of 800 lines (horizontal direction)×600 lines (vertical direction) is performed for 30 frames per second, an output needs to be modulated at a frequency of 14.4 MHz and gradation of at least about 256 steps needs to be produced in the output. To change an output from the SHG light source (as is disclosed in Japanese Patent No. 03329446), there is a method that uses a semiconductor laser provided with a distributed Bragg reflection region and a phase region, by which currents applied to the distributed Bragg reflection region and the phase region are changed using a d.c. power supply, so that an oscillation wavelength of the semiconductor laser is changed within a phase matching wavelength spectrum of an SHG element due to a change of a refractive index resulted from rising heat in respective portions. In this method, however, because a change of the refractive index occurs thermally, a time needed for the change is as long as on the order of msec, and it is difficult to achieve modulation on the order of MHz.

[Patent Document 1] JP-A-2003-98476 (page 4, FIG. 1)

DISCLOSURE OF THE INVENTION

The invention was devised to solve the problems related to modulation of a light output of the SHG light source as discussed above, and has therefore an object to achieve gradation while modulating an output of the SHG light source at higher speeds.

In order to achieve the above and other objects, one aspect of the invention provides a coherent light source including: a semiconductor laser provided with an active region and a distributed Bragg reflection region; a light wavelength conversion element that is made of non-linear optical crystal and converts a wavelength of a laser beam emitted from the semiconductor laser; a photo detector that measures a higher harmonic output from the light wavelength conversion element; current injection means for applying currents independently to the active region and the distributed Bragg reflection region; current control means for controlling the current injection means on the basis of the higher harmonic output measured in the photo detector to fix an oscillation wavelength of the semiconductor laser to an inclined portion within a phase matching wavelength spectrum of the light wavelength conversion element; pulse current injection means for applying a pulse current to at least one region selected from the active region and the distributed Bragg reflection region; and pulse current control means for controlling the pulse current injection means on the basis of the higher harmonic output measured in the photo detector to change the oscillation wavelength of the semiconductor laser to a desired value at the inclined portion within the phase matching wavelength spectrum of the light wavelength conversion element.

According to this aspect, the photo detector measures the higher harmonic output of a laser beam emitted from the semiconductor laser and having undergone wavelength conversion in the light wavelength conversion element. Under this condition, firstly, the current control means controls the current injection means to adjust currents applied to the active region and the distributed Bragg reflection region, so that the oscillation wavelength of the semiconductor laser is fixed to the inclined portion within the phase matching wavelength spectrum. Subsequently, the pulse current injection means applies a pulse current to at least one region selected from the active region and the distributed Bragg reflection region. This instantaneously reduces a refractive index of the region to which the pulse current is applied, and the wavelength of the higher harmonic shifts to the shorter wavelength side, which causes the higher harmonic output to be reduced. In this instance, because the pulse current control means controls the extent to which the higher harmonic output is reduced, it is possible to change the higher harmonic output to a desired value continuously at high speeds.

Also, another aspect of the invention provides a control method of a coherent light source, characterized in that a photo detector detects a higher harmonic output from a light wavelength conversion element that is made of non-linear optical crystal and converts a wavelength of a laser beam emitted from a semiconductor laser, and currents applied to an active region and a distributed Bragg reflection region provided to the semiconductor laser are controlled on the basis of an output from the photo detector, so that the higher harmonic output detected in the photo detector is fixed to an inclined portion within a phase matching wavelength spectrum of the light wavelength conversion element, after which a pulse current is applied to the active region or the distributed Bragg reflection region for the higher harmonic output detected in the photo detector to be changed to a desired value at the inclined portion within the phase matching wavelength spectrum of the light wavelength conversion element.

With the coherent light source using the control method according to another aspect, it is possible to change the higher harmonic output to a desired value continuously at high speeds.

BRIEF DESCRIPTION OF THE DRAWINGS

FIG. 12 is a view showing equipment that can be connected to a laser display in the related art.

BEST MODE FOR CARRYING OUT THE INVENTION

First Embodiment

Figure 1:
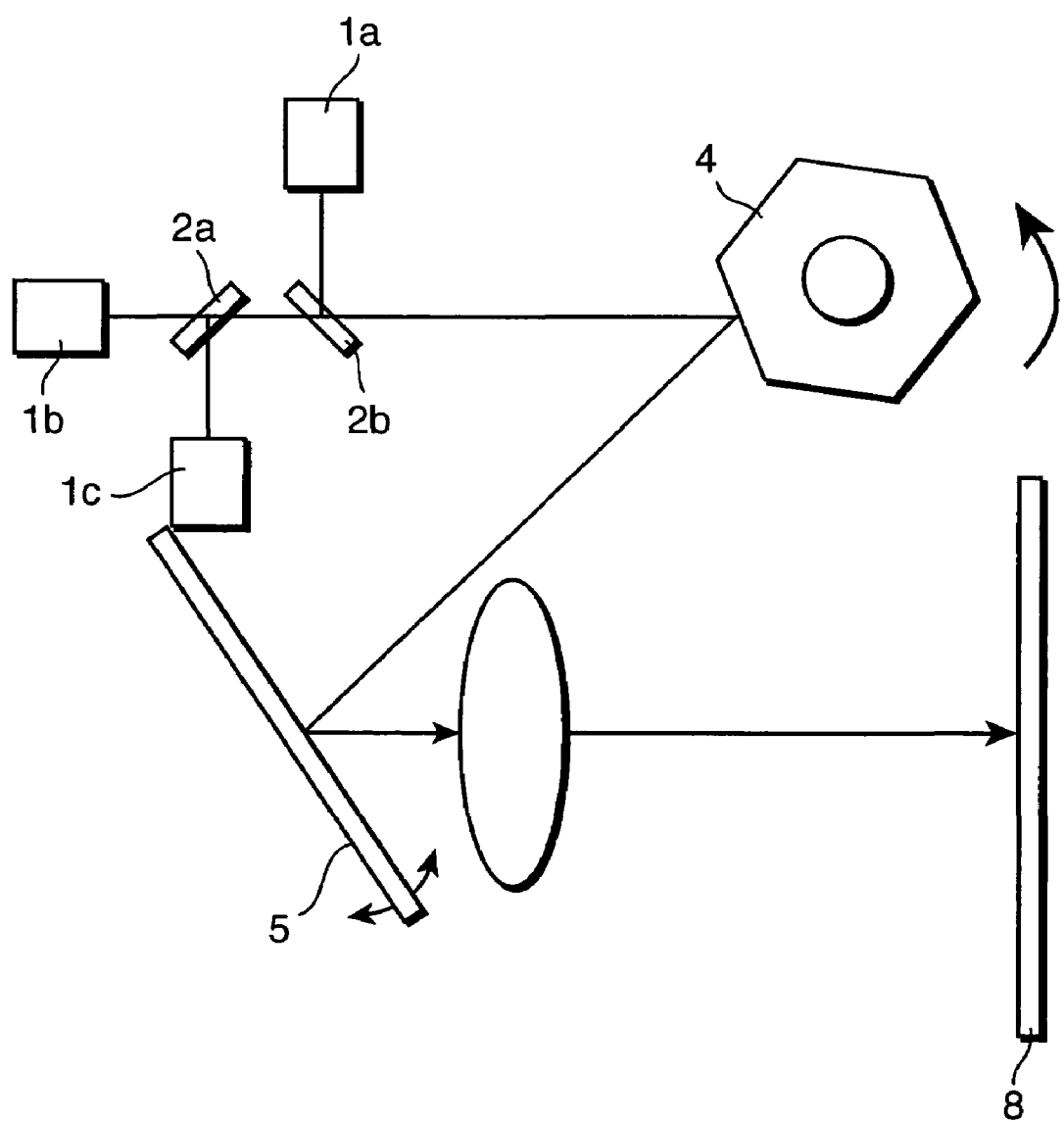
FIG. 1 is a schematic configuration view of a laser display.

FIG. 1 schematically shows the configuration of a laser display. Referring to the drawing, beams of coherent light from laser light sources 1a through 1c of three colors, RGB, undergo intensity modulation according to an input video signal, and are then multiplexed on dichroic mirrors (multiplexing means) 2a and 2b. Further, the light is scanned in the horizontal direction by a polygon scanner (polygon mirror, first scanning means) 4 comprising a rotary polygon mirror and in the vertical direction by a galvanometer mirror (second scanning means) 5, and a two-dimensional image is displayed on a screen 8. The scanning means in the horizontal direction and the scanning means in the vertical direction are not limited to this configuration, and the polygon scanner 4 and the galvanometer mirror 5 can be combined arbitrarily. SHG light sources are used as the green light source 1b and the blue light source 1c. A semiconductor laser is used as the red light source 1a, and an output can be therefore modulated directly at high speeds. Herein, a device having the configuration of the laser display from which the screen is removed is referred to as a display device.

The SHG light source in the first embodiment includes a semiconductor laser (DBR-LD) provided with an active region to yield gains and a distributed Bragg reflection region (DBR region) to control an oscillation wavelength, and a light wavelength conversion element made of non-linear optical crystal. An output modulation control method of the SHG light source will be described herein. It should be noted that the DBR-LD is able to change an oscillation wavelength of the semiconductor laser by changing a refractive index of the DBR region by applying a current to the DBR region for the temperature of the DBR region to rise.

Figure 2:
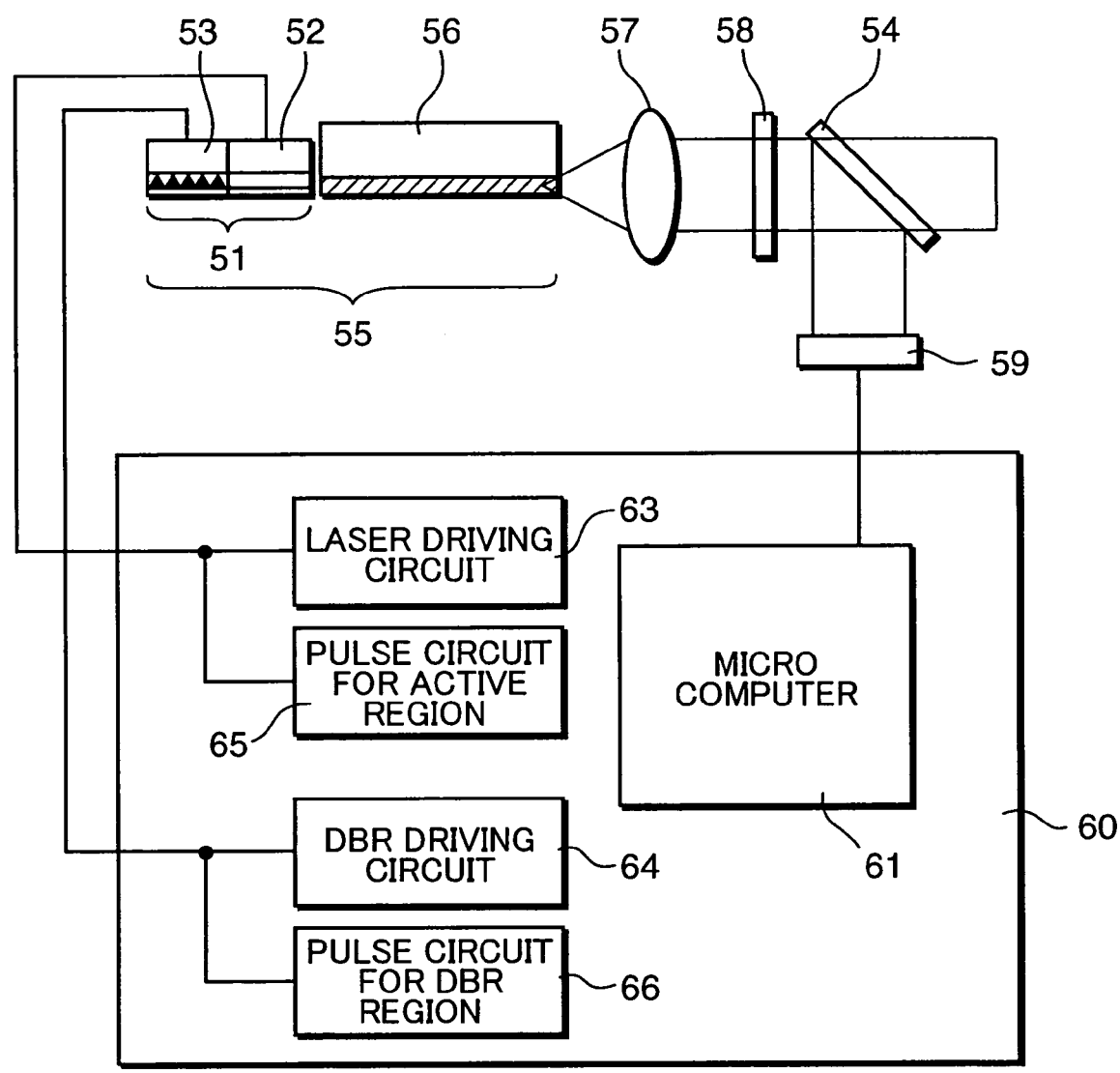
FIG. 2 is a view showing an output control device of an SHG light source.

FIG. 2 is a view schematically showing the configurations of the SHG light source and an output control device of the SHG light source in the first embodiment. Herein, the SHG light source alone and a combination of the SHG light source and the output control device of the SHG light source as a whole are referred to as the coherent light source. The output control device comprises a semiconductor laser (DBR-LD) 51 having an active region 52 and a DBR region 53, a light wavelength conversion element 56, a collimator lens 57 that converts a higher harmonic emitted from the light wavelength conversion element 56 into parallel beams, a wavelength selection filter 58 that filters out the fundamental wave, a beam splitter 54 that splits part of the parallel beams, a photo detector (photo sensor) 59 that monitors a higher harmonic output, and a control circuit 60 that controls the respective portions. Referring to FIG. 2, the active region 52 and the DBR region 53 are partitioned for ease of description; however, they are formed as one unit in practice. In addition, the DBR-LD 51 and the light wavelength conversion element 56 are formed as one unit to serve as an SHG light source 55.

In the control circuit 60 are incorporated a micro computer (current control means and pulse current control means) 61 that performs control, a laser driving circuit (current injection means) 63 that controls a current (hereinafter, referred to as Iop) applied to the active region 52 of the semiconductor laser, and a DBR driving circuit (current injection means) 64 that controls a current (hereinafter, referred to as Idbr) applied to the DBR region 53. Further, a pulse circuit (pulse current injection means) 65 for active region that applies a pulse current to the active region 52, and a pulse circuit (pulse current injection means) 66 for DBR region that applies a pulse current to the DBR region 53 are additionally provided.

In the first embodiment, the DBR-LD 51 is, for example, an AlGaAs semiconductor laser, and has a rated output of 100 mW, a threshold value of 30 mA, and an operating current of 150 mA on a 100-mW-output. A polarization inversion optical waveguide device having an element length of 10 mm is used as the light wavelength conversion element 56, in which optical waveguides and periodic polarization inversion regions are provided on a magnesium-doped lithium niobate substrate.

When blue light is emitted from the light wavelength conversion element 56, for example, a DBR-LD 51 that emits a laser beam in a 850-nm band is used and the polarization inversion period is set to 3.2 μm. When configured in this manner, blue light having a wavelength of about 425 nm can be obtained. Also, when green light is emitted from the wavelength conversion element 56, for example, a DBR-LD 51 that emits a laser beam in a 1064-nm band is used and the polarization inversion period is set to 6.7 μm. When configured in this manner, green light having a wavelength of about 532 nm can be obtained.

Hereinafter, a control method will be described, by which not only can a desired output be obtained from the SHG light source in the first embodiment, but also gradation can be achieved in the output by modulating the output at high speeds.

Figure 3:
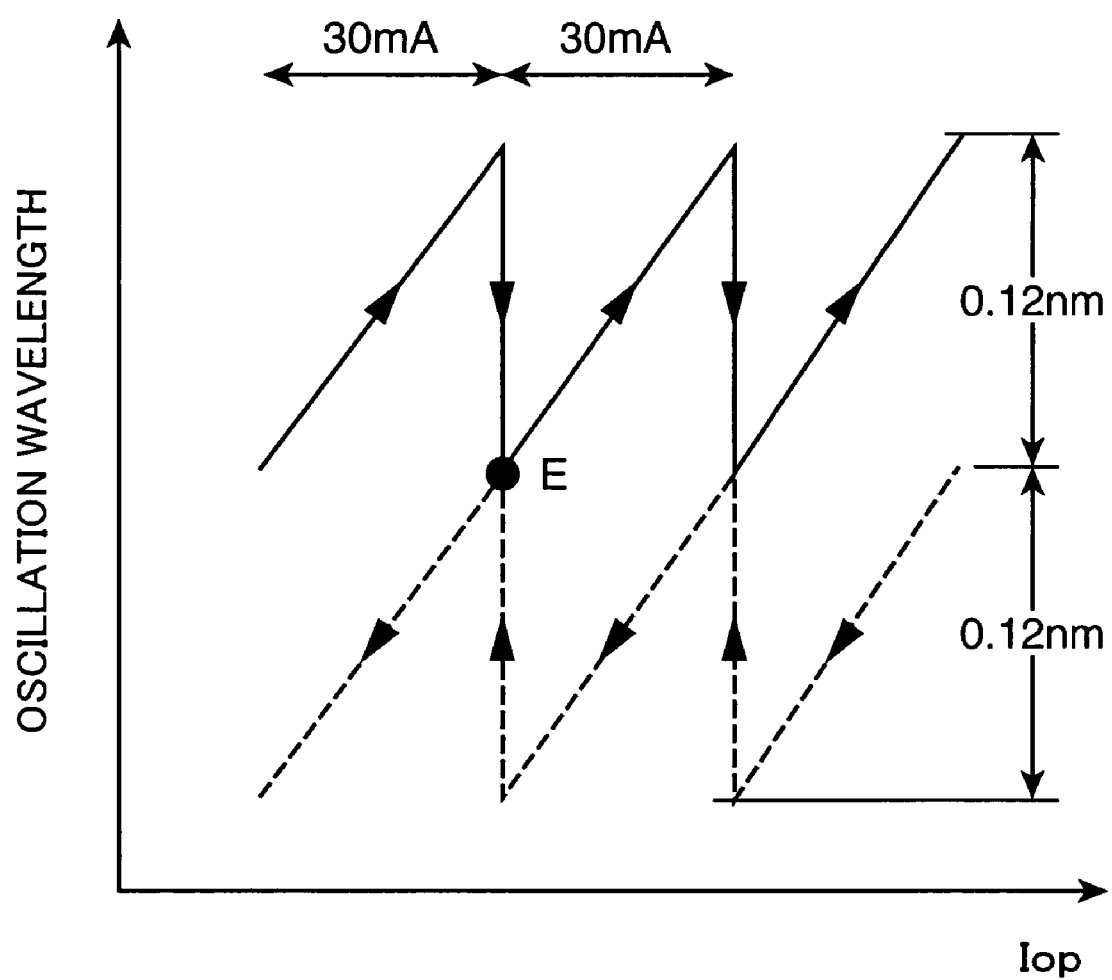
FIG. 3 is a view showing a characteristic of an oscillation wavelength when Iop is changed in a DBR-LD.

FIG. 3 shows a change of the oscillation wavelength of the DBR-LD 51 in response to a change of the Iop. Herein, Idbr=0 mA is given. A solid line of FIG. 3 represents a change of the wavelength when the Iop is increased. A dotted line of FIG. 3 represents a change of the wavelength when the Iop is reduced. It is understood from FIG. 3 that the oscillation wavelength of the DBR-LD 51 changes by repeating mode hopping as the Iop is increased. The mode hopping is attributed to the influences of the DBR region 53.

Also, as is shown in FIG. 3, the oscillation wavelength of the DBR-LD 51 in response to a change of the Iop has a hysteresis characteristic. In the DBR-LD 51 in the first embodiment, it is confirmed that no mode hopping occurs for ±30 mA from a point (point E) immediately after the occurrence of mode hopping. This indicates that a mode-hopping point is the most stable point. Hence, when the oscillation wavelength of the DBR-LD 51 is controlled, the wavelength can be stabilized when changed in the vicinity of the mode-hopping point. A change of the wavelength in this instance is 0.004 nm/mA. This means that the oscillation wavelength of the DBR-LD 51 can be changed continuously by ±0.12 nm without causing mode hopping.

Figure 4:
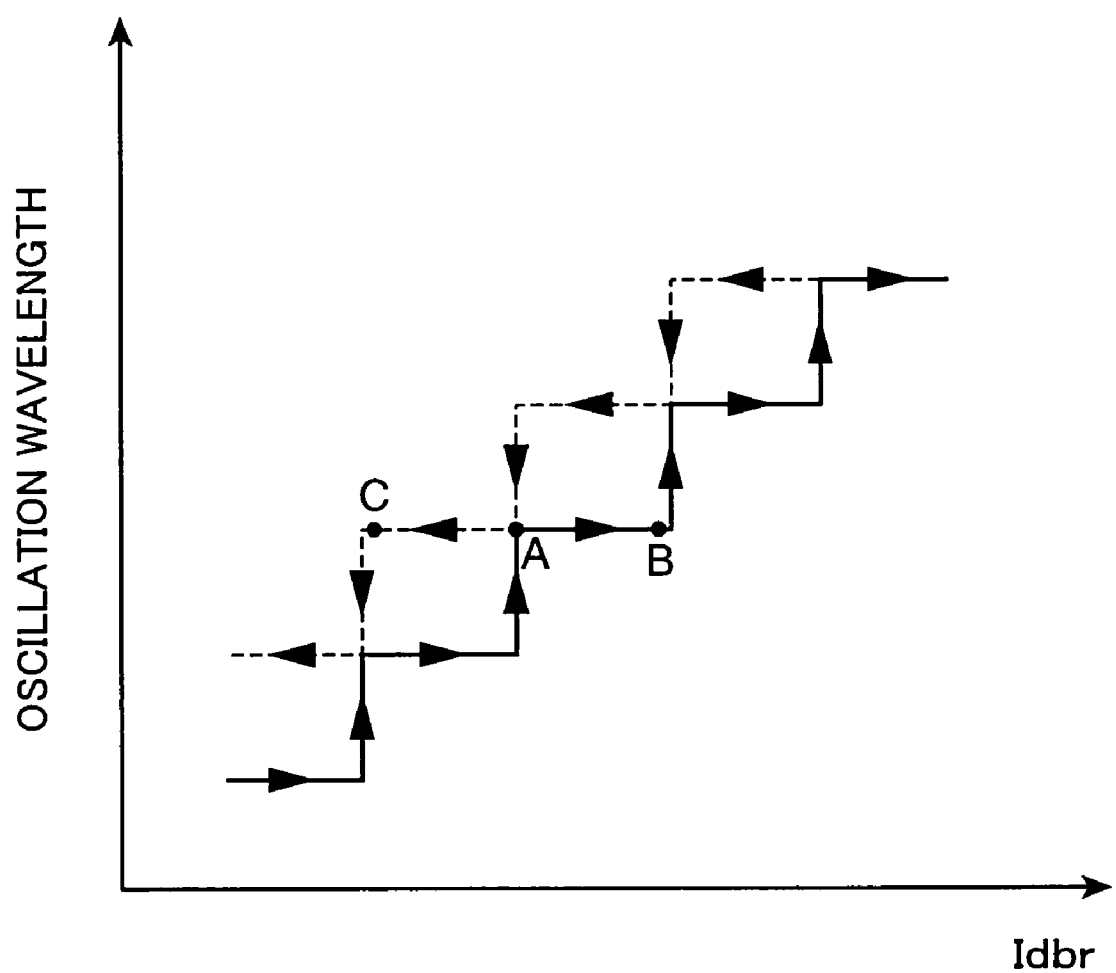
FIG. 4 is a view showing a characteristic of an oscillation wavelength when Idbr is changed in a DBR-LD.

FIG. 4 shows the oscillation wavelength when the Idbr is changed while the Iop is maintained to be Iop=100 mA. It is understood from FIG. 4 that the oscillation wavelength of the DBR-LD 51 is increased step-wise as the Idbr is increased. In this embodiment, the width (transverse direction) of the step is approximately 10 mA, and the height (longitudinal direction) of the step is approximately 0.1 nm. The oscillation wavelength is different when the Idbr is increased and when the Idbr is reduced, and it has a hysteresis characteristic as shown in the drawing. Hence, when the Idbr is fixed to the vicinity of a current value (a point B and a point C in the drawing) at which mode hopping occurs, mode hopping readily occurs due to a change in environmental temperature or the like, which makes the oscillation wavelength unstable. In order to stabilize the oscillation wavelength, it is therefore preferable to fix the Idbr to a current value (a point A in the drawing) immediately after the occurrence of mode hopping of the oscillation wavelength of the semiconductor laser. It is understood from FIG. 3 and FIG. 4 that the oscillation wavelength of the DBR-LD 51 can be changed continuously within a limited range by changing the Iop and the Idbr.

Figure 5:
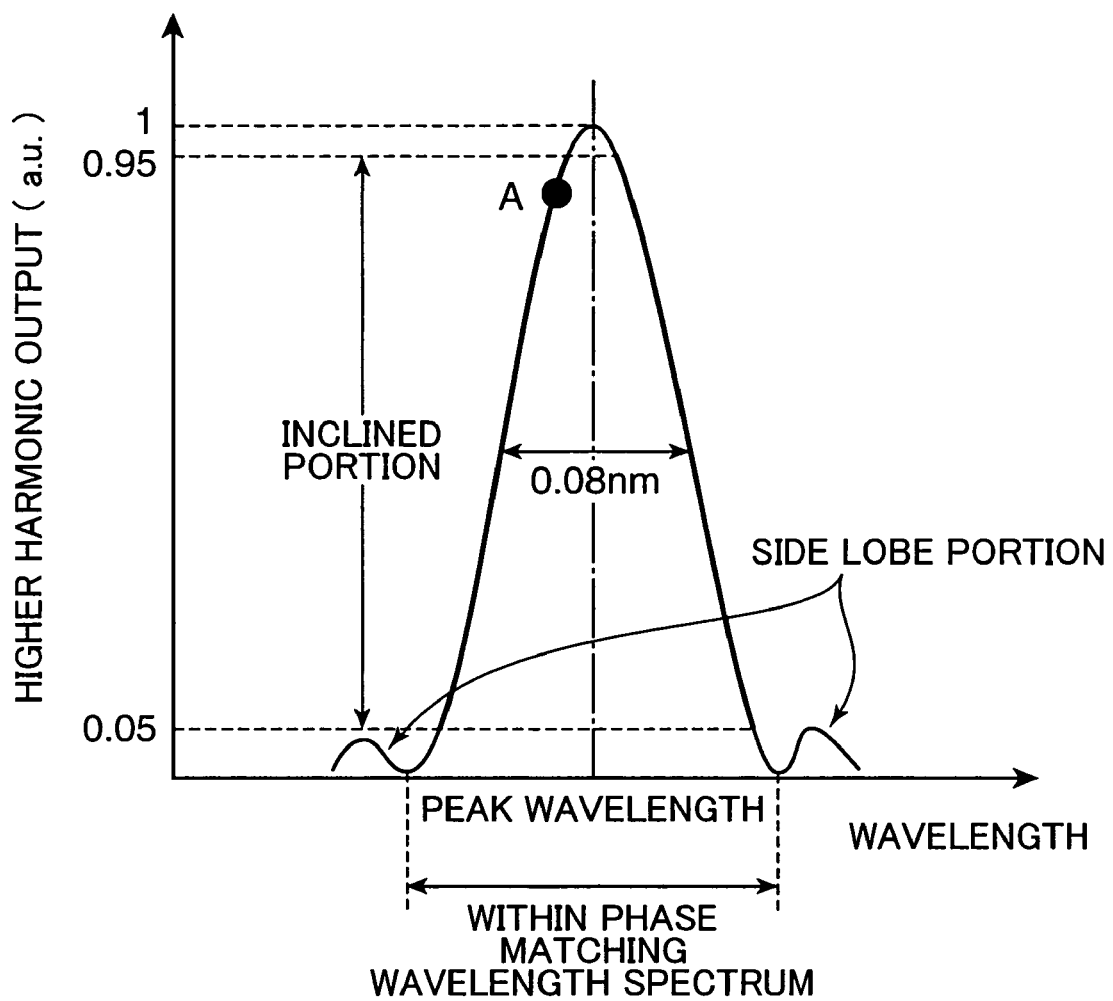
FIG. 5 is a view showing a phase matching wavelength spectrum of a light wavelength conversion element.

FIG. 5 shows a phase matching wavelength spectrum of the light wavelength conversion element 56. Referring to the drawing, "1" is given as the peak output for the standardization of a higher harmonic output. As is shown in FIG. 5, the light wavelength conversion element has different conversion efficiency from the fundamental wave to a higher harmonic for an oscillation wavelength of the semiconductor laser, which is the fundamental wave. For example, when the length of the light wavelength conversion element is 10 mm, a phase matching wavelength allowable width (half width at half maximum) at which a higher harmonic output is half the value of the peak output is as narrow as 0.08 nm. As can be understood from FIG. 5, in order to output a higher harmonic, it is necessary to cause the oscillation wavelength of the semiconductor laser to fall within the phase matching wavelength spectrum of the light wavelength conversion element. "Within the phase matching wavelength spectrum" referred to herein means a range of the wavelength including the peak wavelength, within which the higher harmonic output is minimal on the shorter wavelength side and on the longer wavelength side in reference to the peak wavelength. In short, side lobe portions of FIG. 5 are outside the phase matching wavelength spectrum. The peak wavelength means a wavelength at which the higher harmonic output is maximal (peak output).

A higher harmonic output is obtained by fixing the oscillation wavelength of the semiconductor laser within the phase matching wavelength spectrum of the light wavelength conversion element 56 using the DBR-LD 51. It is possible to change a higher harmonic output by changing the Iop and the Idbr, so that the oscillation wavelength of the DBR-LD 51 is changed within the phase matching wavelength spectrum as are shown in FIG. 3 and FIG. 4, which enables gradation to be produced in the output. It should be noted, however, that when the Iop is changed while the Idbr is fixed as is shown in FIG. 3, the oscillation wavelength of the DBR-LD 51 can be changed continuously only within a limited range (±0.12 nm in this embodiment). Hence, in order to produce gradation in a wider range, a value of the wavelength that can be changed needs to be larger than the half width at half maximum (0.08 nm in this embodiment) of the phase matching wavelength spectrum or in the vicinity thereof.

Within the phase matching wavelength spectrum shown in FIG. 5, a portion where the higher harmonic output is in a range from 5% to 95%, both inclusive, of the peak output is referred to as an inclined portion (a thick line portion of the spectrum). The inclined portion has a characteristic that it is easy to produce gradation because an output in response to the wavelength varies almost linearly. It is thus preferable to use the inclined portion when an output of the SHG light source is set.

Also, the inclined portion is present on each of the shorter wavelength side and the longer wavelength side in reference to the peak wavelength. Of these inclined portions, it is preferable to use the portion on the shorter wavelength side in reference to the peak wavelength when an output of the SHG light source is set. This is because, as can be understood from FIG. 4, the Idbr can be smaller, that is, more power consumption can be saved, by fixing the wavelength to the portion on the shorter wavelength side in reference to the peak wavelength than by fixing the wavelength to the portion on the longer wavelength side.

In addition, because the control circuit has an error accuracy of about ±5%, there is a risk that a desired value cannot be obtained by changing the Iop and the Idbr when a portion other than the inclined portion is used, for example, when the higher harmonic output is fixed to a point exceeding 95% of the peak output.

A change of the oscillation wavelength of the DBR-LD 51 using the Iop and the Idbr as described above is a phenomenon induced thermally. It is a phenomenon induced by a change of the refractive indexes of the active region 52 and the DBR region 53 that occurs in association with a change of the heat in the active region 52 and the DBR region 53 resulted from a change of the Iop and the Idbr. A change of the oscillation wavelength is therefore a phenomenon taking place on the order of msec, which is insufficient for a speed at which a moving image is outputted as a video. In order to output a moving image, a wavelength changing speed at least on the order of MHz, that is, on the order of nsec to several μsec, is required.

Hence, a pulse current is applied using the pulse circuit 66 for DBR region that applies a pulse current to the DBR region 53. When pulse currents are applied to the active region 52 and the DBR region 53, for example, a carrier density in the semiconductor is increased, which gives rise to a phenomenon called the plasma effect. This reduces the refractive index of the DBR region 53 instantaneously. In this instance, because the oscillation wavelength of the DBR-LD 51 shifts to the shorter wavelength side instantaneously, a higher harmonic output is reduced. In addition, because a pulse current is used, thermal change hardly occurs. By controlling the oscillation wavelength of the DBR-LD 51 at high speeds through the wavelength control using the plasma effect as has been described, not only is it possible to modulate a higher harmonic output on the order of nsec, but it is also possible to produce gradation.

Figure 6:
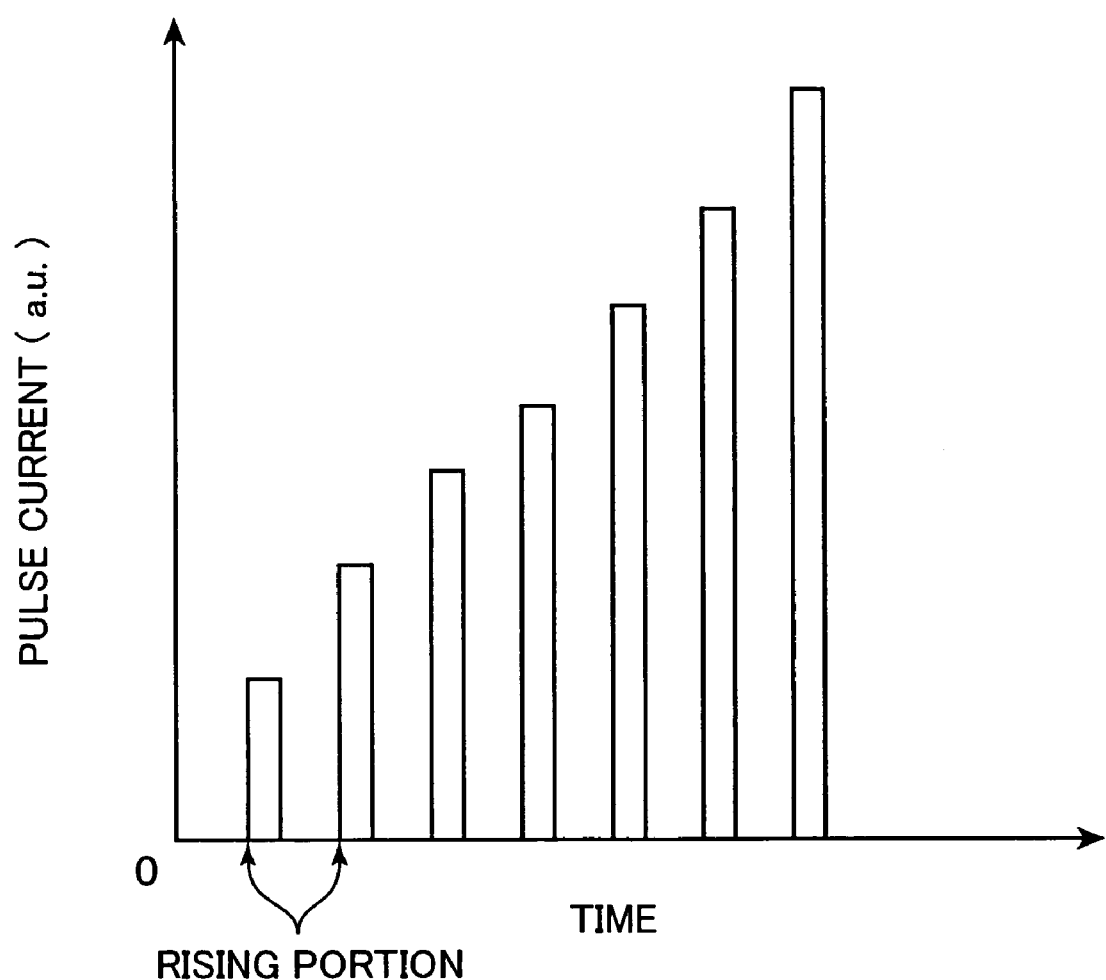
FIG. 6 is a view showing a pulse current applied to a DBR region.

To be more concrete, the oscillation wavelength of the DBR-LD 51 is first controlled to be fixed to the point A within the phase matching wavelength spectrum of FIG. 5. Subsequently, the plasma effect is induced by applying a pulse current as shown in FIG. 6 to the DBR region 53. A rectangular pulse is applied to the DBR region 53 as an example of the pulse current. It should be noted that a major factor that markedly influences the plasma effect is a shape of the rising portion of the pulse. Because the carrier density is increased more instantaneously as the rising portion has a sharper gradient, the plasma effect can be induced effectively. It is therefore more preferable to use a rectangular pulse than using, for example, a triangular pulse, a pulse having an obtuse rising portion or the like. In addition, the pulse can have an arbitrary width because the width hardly gives influence to the plasma effect; however, heat is generated more in the DBR region 53 as the pulse width becomes wider. It is therefore preferable to make a pulse width as narrow as possible.

Figure 7:
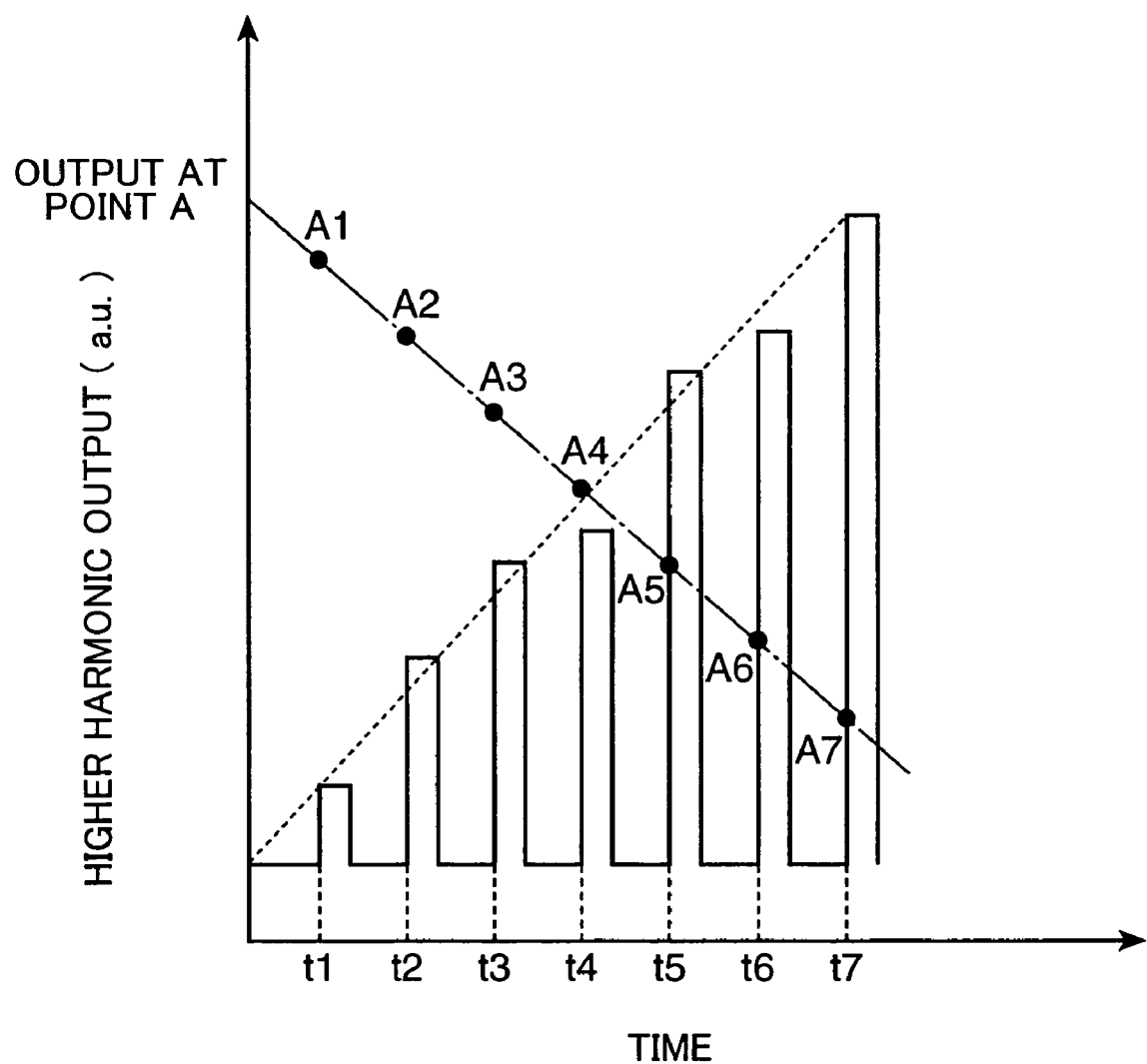
FIG. 7 is a view showing a characteristic of a higher harmonic output when a pulse current is applied to the DBR region.
Figure 8:
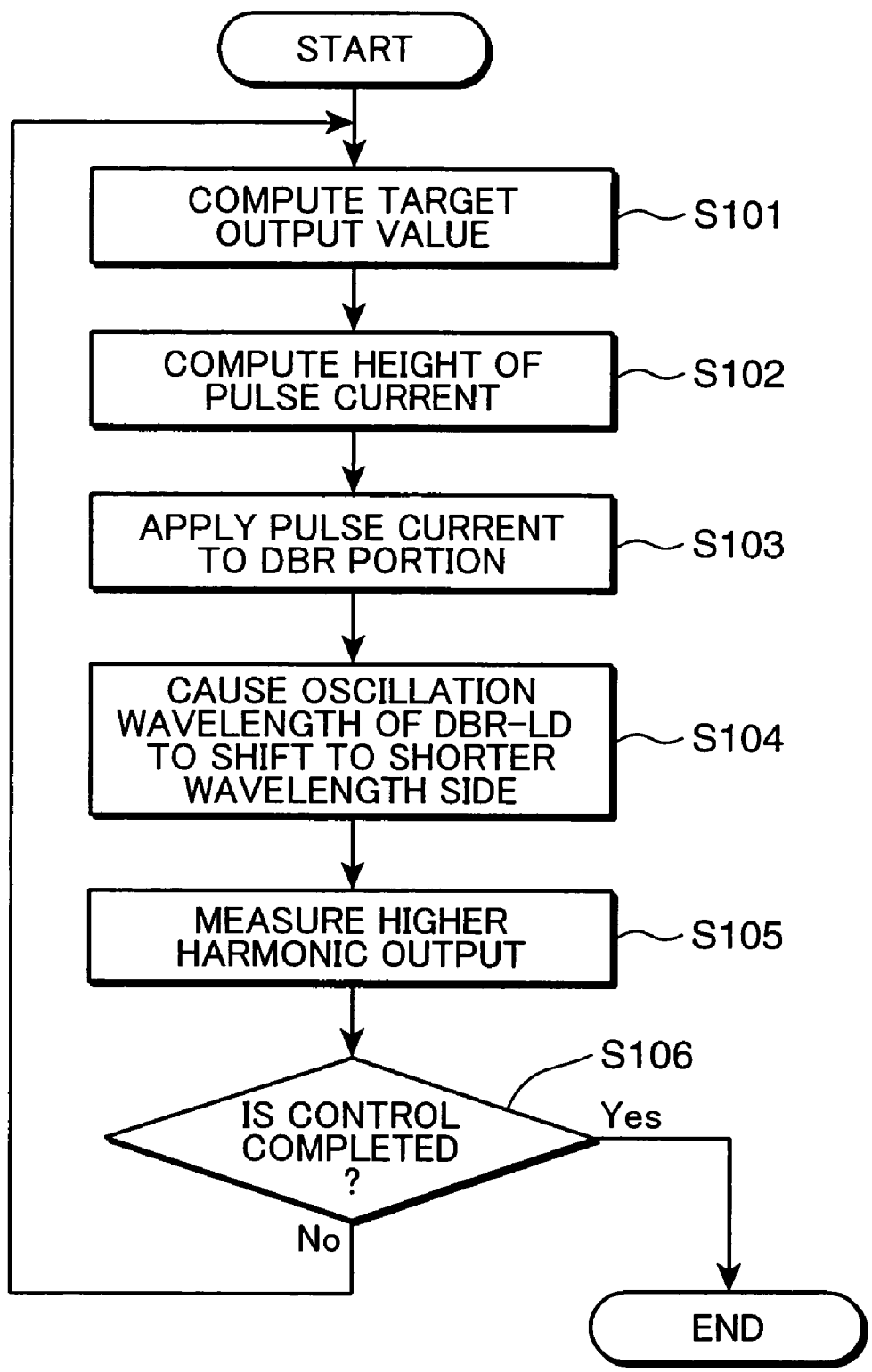
FIG. 8 is a flowchart detailing the processing when a higher harmonic output is controlled by applying a pulse current to the DBR region.

FIG. 7 is a view showing a change of a higher harmonic output (an alternate long and sort dash line in the drawing) when the same pulse current (a solid line in the drawing) as that of FIG. 6 is applied after the oscillation wavelength is fixed to the point A. In this example, it is assumed that the higher harmonic output is controlled so that it reaches a target output value A7 at a time t7 while being reduced linearly at arbitrary times up to the time t7. In other words, the output values A1 through A7 of the higher harmonic are assumed to be target output values at the times t1 through t7, respectively. Also, FIG. 8 is a flowchart detailing the processing when the higher harmonic output is controlled by applying a pulse current to the DBR region 53.

The micro computer 61 first computes the target output value A1 at the time t1 so that the higher harmonic output achieves the target output value A7 at the time t7 (Step S101). Subsequently, the micro computer 61 computes the height of the pulse current achieving the target output value A1 (Step S102), and applies the pulse current having the computed height to the DBR region 53 by controlling the pulse circuit 66 for DBR region (Step S103). This causes the oscillation wavelength of the DBR-LD 51 to shift to the shorter wavelength side (Step S104). In the absence of a factor such that changes the higher harmonic output, ideally speaking, the height of the pulse current takes linear values indicated by a dotted line in FIG. 7. In practice, however, because the temperature or the like of the DBR region 53 changes, the higher harmonic output often fails to achieve the target output value even when the pulse current having the computed height is applied.

Hence, the higher harmonic output emitted from the light wavelength conversion element 56 is measured using the photo detector 59 (Step S105). Because the time t7 has not come yet, the control is not completed (No in Step S106), and the flow returns to Step S101 to perform feedback control on the basis of a value measured in the photo detector 59. For example, assume that the higher harmonic output is larger than the target output value A1 as a result when the pulse current is applied at the time t1. Then, the height of the pulse current at the time t2 computed in Step S102 needs to be set to a value larger than an ideal value indicated by a dotted line.

Thereafter, the processing as described above is performed sequentially, and when the higher harmonic output measured at the preceding time is larger than the target output value, the height of the pulse current is computed to be a value larger than an ideal value due to the need to reduce the output value; conversely, when the higher harmonic output measured at the preceding time is smaller than the target output value, the height of the pulse current is computed to be smaller due to the need to increase the output value. When the height of the pulse current is made larger or smaller than the ideal value, for example, it may be configured in such a manner that the height is multiplied by a specific coefficient in response to a difference between the target output value and the value measured in the photo detector 59.

As has been described with reference to FIG. 7, the higher harmonic output changes instantaneously as the output is changed (the output is reduced in this case) in response to the amplitude (pulse height) of the pulse current. In addition, it is possible to produce continuous gradation using the inclined portion of the phase matching wavelength spectrum.

As has been described, it is possible in the first embodiment to set a higher harmonic output, having undergone wavelength conversion in the light wavelength conversion element using the DBR-LD 51, to a desired value at high speeds. The laser light source can be therefore modulated at high speeds and gradation can be produced, which allows the use in a device that needs a high-speed response and the output control, such as a display device.

When used as the light source of the display, a response in the absence of a video signal (when black is outputted) is necessary. In this case, it is most effective to reduce the Iop, which is the current applied to the active region 52, to 0. When Iop=0, because no fundamental wave is outputted from the semiconductor laser, the higher harmonic output is naturally reduced to 0. Alternatively, the higher harmonic output is reduced to 0 by applying pulse currents to the active region 52 and the DBR region 53, so that the oscillation wavelength of the DBR-LD 51, which is now within the phase matching wavelength spectrum, fluctuates markedly to be outside the spectrum.

In addition, when a video is outputted by scanning a laser beam, the end of the screen is constantly in a state having no video output. Hence, it is possible to stabilize the output of the light source using this region. The micro computer 61 suspends the supply of the Iop to the active region 52 when the scan reaches the end of the screen, and during the suspended time the DBR current is confirmed and re-adjusted for the higher harmonic output to be outputted in a stable manner.

When used as the light source of the display, there may be a case where a high-output signal is outputted continuously. In this instance, the temperature of the DBR-LD 51 may possibly rise gradually. Hence, the mere control using the plasma effect induced by applying the pulse current may fail to control a change of heat. In this case, the micro computer 61 may be configured in such a manner that it cancels out a change of the wavelength resulted from rising heat by gradually changing the Iop and the Idbr in advance.

Second Embodiment

A second embodiment will describe a control method of an SHG light source including a semiconductor laser (triple-electrode LD) provided with an active region to yield gains, a distributed Bragg reflection region (DBR region) to control the oscillation wavelength, and a phase region to change the wavelength continuously, and a light wavelength conversion element made of non-linear optical crystal. The triple-electrode LD is able to change the oscillation wavelength of the semiconductor laser continuously without causing mode hopping by changing a practical cavity length of the semiconductor laser, which can be achieved by applying a current to the phase region to change the refractive index of the phase region.

Figure 9:
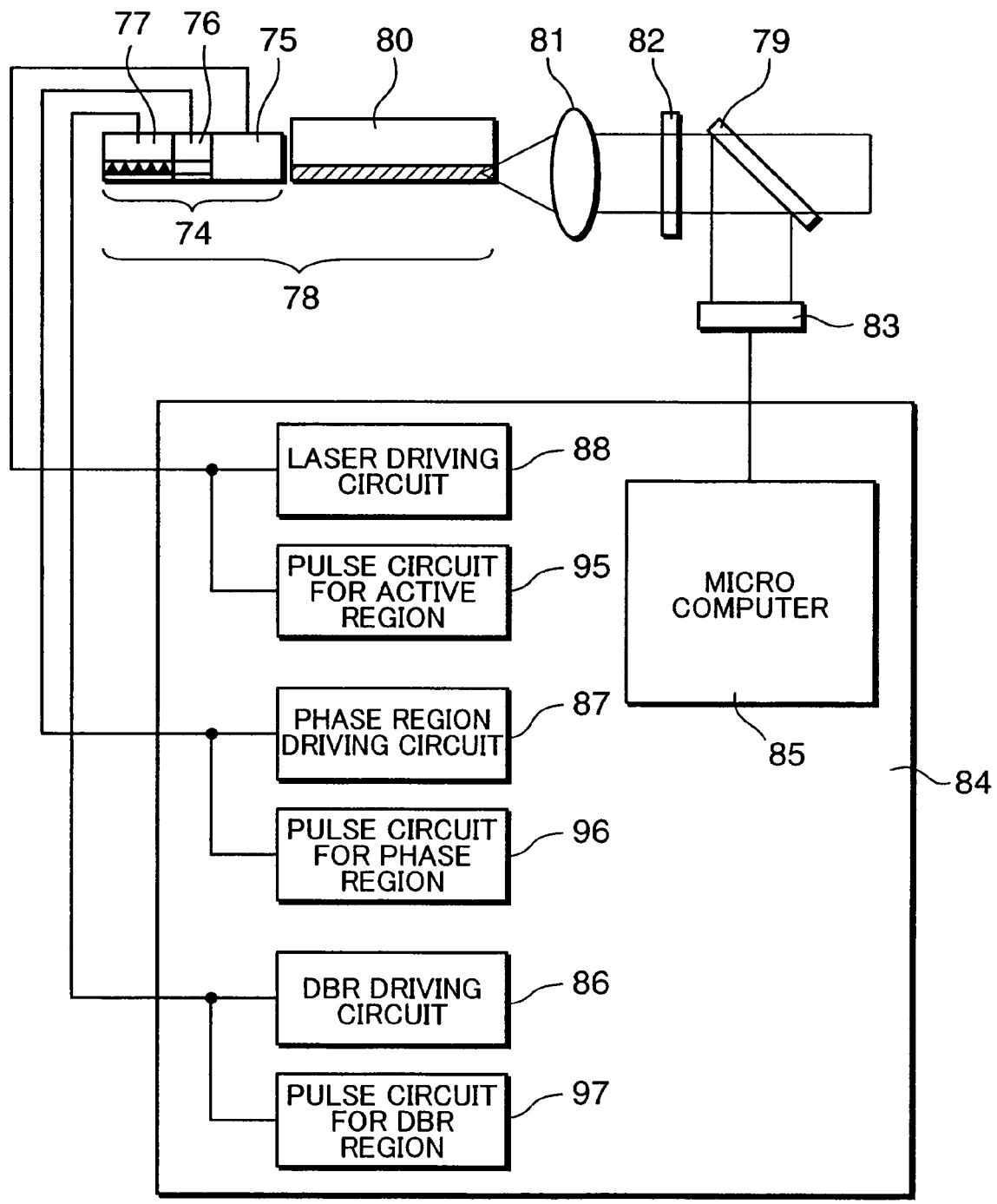
FIG. 9 is a block diagram schematically showing the configuration of an output control device of an SHG light source using a triple-electrode LD in a second embodiment.

FIG. 9 is a view schematically showing the configuration of an output control device of the SHG light source in the second embodiment. The output control device comprises a semiconductor laser (triple-electrode LD) 74 having an active region 75, a DBR region 77, and a phase region 76, a light wavelength conversion element 80, a collimator lens 81 that coverts a higher harmonic emitted from the light wavelength conversion element 80 into parallel beams, a wavelength selection filter 82 that filters out the fundamental wave, a beam splitter 79 that splits part of a higher harmonic, a photo detector (photo sensor) 83 that monitors a higher harmonic output, and a control circuit 84 that controls the respective portions. Referring to FIG. 9, the active region 75, the DBR region 77, and the phase region 76 are partitioned for ease of description; however, they are formed as one unit in practice. Also, the triple-electrode LD 74 and the light wavelength conversion element 80 are formed as one unit to serve as an SHG light source 78.

In the control circuit 84 are incorporated a micro computer (current control means and pulse current control means) 85 that performs control, a laser driving circuit 88 that controls a current (Iop) applied to the active region 75 of the semiconductor laser, a DBR driving circuit 86 that controls a current (Idbr) applied to the DBR region 77, and a phase region driving circuit 87 that controls a current (hereinafter, referred to as Iphase) applied to the phase region 76. The laser driving circuit 88, the DBR driving circuit 86, and the phase region driving circuit 87 are furnished with a function as current injection means of this embodiment.

Further, a pulse circuit 95 for active region that applies a pulse current to the active region 75, a pulse circuit 97 for DBR region that applies a pulse current to the DBR region 77, and a pulse circuit 96 for phase region that applies a pulse current to the phase region 76 are additionally provided. The pulse circuit 95 for active region, the pulse circuit 97 for DBR region, and the pulse circuit 96 for phase region are furnished with a function as the pulse current injection means of this embodiment.

Figure 10:
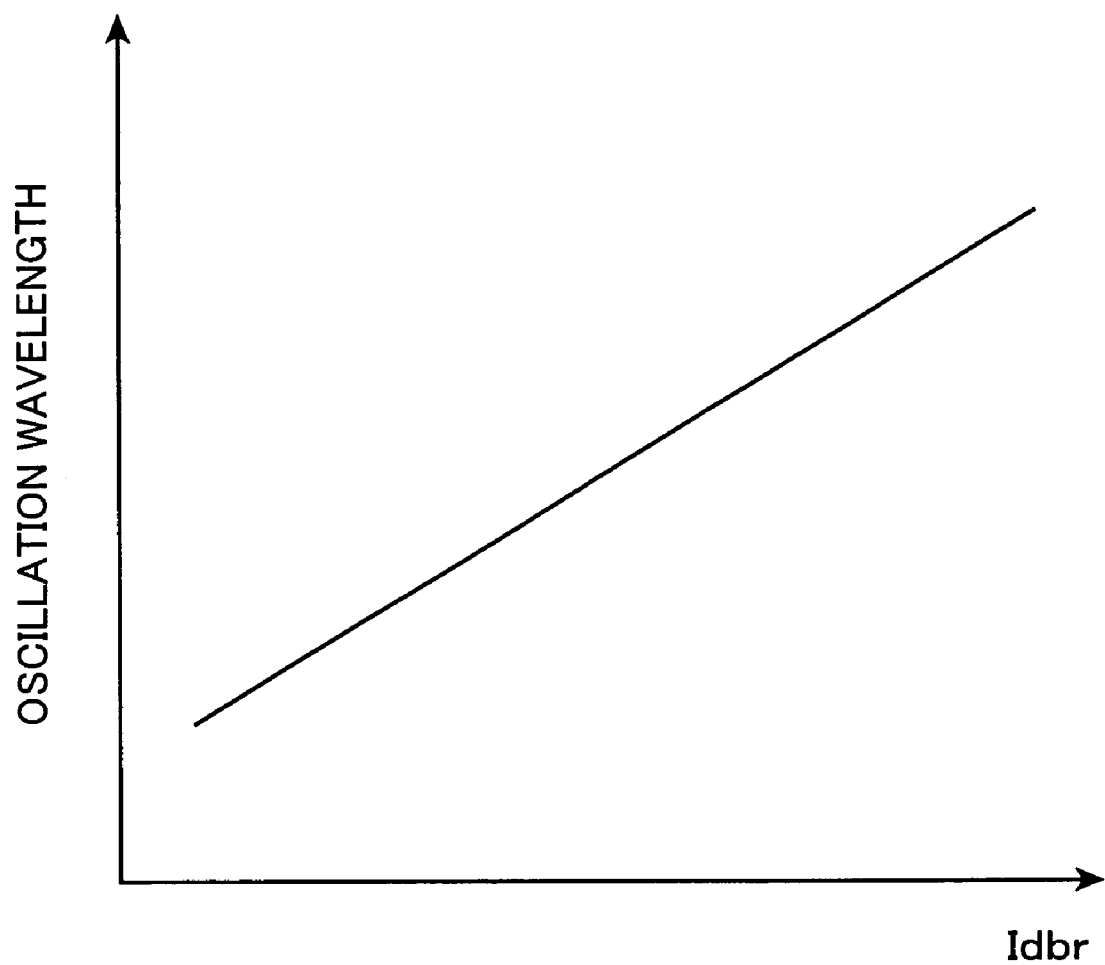
FIG. 10 is a view showing a characteristic of an oscillation wavelength when Idbr is changed by setting a constant ratio between Idbr and Iphase in the triple-electrode LD.
Figure 11:
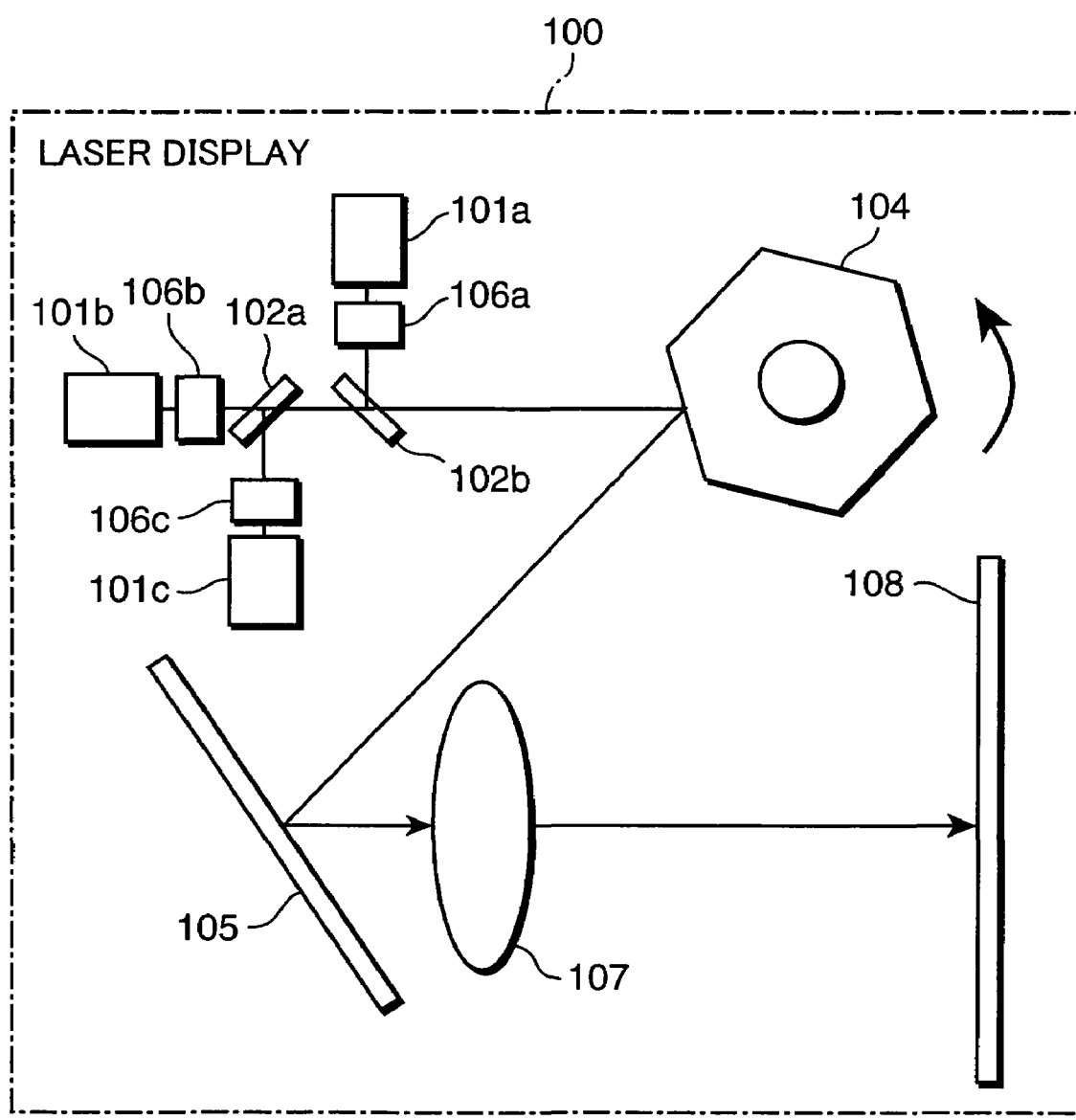
FIG. 11 is a view schematically showing the configuration of a laser display.

In the second embodiment, as is shown in FIG. 10, the triple-electrode LD 74 has a characteristic that it is able to change a wavelength continuously. Herein, because continuous tuning cannot be achieved unless the Idbr and the Iphase are changed at a given constant ratio, the Idbr and the Iphase are changed at a ratio, Iphase/Idbr=1.6, in the second embodiment. It should be noted that the ratio is not limited to 1.6 and can take an arbitrary value. Also, the light wavelength conversion element 80 used herein is the same as the one in the first embodiment.

When the triple-electrode LD is used as in the second embodiment, because the oscillation wavelength of the semiconductor laser can be changed continuously, it is quite easy to fix the oscillation wavelength within the phase matching wavelength spectrum of the light wavelength conversion element. In addition, as in the first embodiment, it is possible to obtain a desired higher harmonic output by changing the higher harmonic output with ease, using the inclined portion of the phase matching wavelength spectrum of the light wavelength conversion element.

The inclined portion referred to herein is preferably, as in the first embodiment, a portion in the phase matching wavelength spectrum shown in FIG. 5 within which a higher harmonic output is in a range from 5% to 95%, both inclusive, of the peak output. It is preferable to use the inclined portion when the output of the SHG light source is set. The inclined portion having a higher harmonic output in a region from 5% to 95%, both inclusive, of the peak output has a characteristic that it is easy to produce gradation because an output in response to the wavelength changes almost linearly. In addition, because the control circuit has an error accuracy of about ±5%, there is a risk that a desired value cannot be obtained by changing the oscillation wavelength of the triple-electrode LD when a portion other than the inclined portion is used, for example, when the higher harmonic output is fixed to a point exceeding 95% of the peak output.

A change of the oscillation wavelength of the triple-electrode LD using the Iop, the Idbr, and the Iphase as described above is a phenomenon induced thermally. It is a phenomenon induced by a change of the refractive indexes of the active region 75, the DBR region 77, and the phase region 76 that occurs in association with a change of heat in the active region 75, the DBR region 77, and the phase region 76 resulted from a change of the Iop, the Idbr, and the Iphase. A change of the oscillation wavelength is therefore a phenomenon taking place on the order of msec, which is insufficient for a speed at which a moving image is outputted as a video. In order to output a moving image, a wavelength changing speed at least on the order of MHz, that is, on the order of nsec to several μsec, is required.

Hence, pulse currents are applied using the pulse circuit 95 for active region that applies a pulse current to the active region 75, the pulse circuit 97 for DBR region that applies a pulse current to the DBR region 77, and the pulse circuit 96 for phase region that applies a pulse current to the phase region 76. When pulse currents are applied to the active region 75, the DBR region 77, and the phase region 76, for example, a carrier density in the semiconductor is increased, which gives rise to a phenomenon called the plasma effect. This reduces the refractive indexes of the respective portions instantaneously. In this instance, the oscillation wavelength of the triple-electrode LD shifts to the shorter wavelength side instantaneously. In addition, because a pulse current is used, thermal change hardly occurs. By controlling the oscillation wavelength of the triple-electrode LD at high speeds through the wavelength control using the plasma effect as has been described, it is possible to modulate a higher harmonic output on the order of nsec.

To be more concrete, the oscillation wavelength of the triple-electrode LD is first controlled to be fixed to the point A of FIG. 5 as in the first embodiment. Subsequently, the plasma effect is induced by applying pulse currents to the phase region 76 and the DBR region 77. The refractive indexes of the phase region 76 and the DBR region 77 are reduced instantaneously due to the plasma effect, and a higher harmonic output is reduced instantaneously because the oscillation wavelength of the triple-electrode LD becomes shorter. When the triple-electrode LD is used, the wavelength can be changed by applying a pulse current to the DBR region 77 alone or by applying a pulse current to the phase region 76 alone. As a result, the characteristic as is shown in FIG. 7 is also obtained when the triple-electrode LD is used, which enables continuous gradation to be produced.

As has been described, it is possible in the second embodiment to set a higher harmonic output, having undergone wavelength conversion in the light wavelength conversion element using the triple-electrode LD, to a desired value at high speeds. The laser light source can be thus modulated at high speeds and gradation can be produced, which allows the use in a device that needs a high-speed response, such as the display device.

When used as the light source of the display, a response in the absence of a video signal (when black is outputted) is necessary. In this case, it is most effective to reduce the Iop, which is the current applied to the active region 75, to 0. When Iop=0, because no fundamental wave is outputted from the semiconductor laser, the higher harmonic output is naturally reduced to 0. Alternatively, the higher harmonic output is reduced to 0 by applying pulse currents to the active region 75, the DBR region 77, and the phase region 76, so that the oscillation wavelength of the triple-electrode LD, which is now within the phase matching wavelength spectrum, fluctuates markedly to be outside the spectrum.

In addition, when a video is outputted by scanning a laser beam, the end of the screen is constantly in a state having no video output. Hence, it is possible to stabilize the output of the light source using this region. The micro computer 85 suspends the supply of the Iop to the active region 75 when the scan reaches the end of the screen, and during the suspended time the Idbr and the Iphase are confirmed and re-adjusted for the higher harmonic output to be outputted in a stable manner.

When used as the light source of the display, there may be a case where a high-output signal is outputted continuously. In this instance, the temperature of the triple-electrode LD may possibly rise gradually. Hence, the mere control using the plasma effect induced by applying the pulse current may fail to control a change of heat. In this case, the micro computer 85 may be configured in such a manner that it cancels out a change of the wavelength resulted from rising heat by gradually changing the Iphase and the Idbr in advance.

Other Embodiments (A) The embodiments above of the invention have described cases where a magnesium-doped lithium niobate (LiNbo₃) is used as a material of the light wavelength conversion elements 56 and 80. However, the invention is not limited to this configuration, and LiNbO₃(LN), LiTaO₃ (LT), KTiOPoO₄(KTP), RbTiOAsO₄, RbTiOPO₄, etc. can be used as well. Further, a non-linear organic polymer may be also used as a material of the light wavelength conversion elements 56 and 80.

SUMMARY OF THE EMBODIMENTS

The summary of the embodiments of the invention will be described in the following.

(1) As has been described above, a coherent light source according to the present application is characterized by comprising: a semiconductor laser provided with an active region and a distributed Bragg reflection region; a light wavelength conversion element that is made of non-linear optical crystal and converts a wavelength of a laser beam emitted from the semiconductor laser; a photo detector that measures a higher harmonic output from the light wavelength conversion element; current injection means for applying currents independently to the active region and the distributed Bragg reflection region; current control means for controlling the current injection means on the basis of the higher harmonic output measured in the photo detector to fix an oscillation wavelength of the semiconductor laser to an inclined portion within a phase matching wavelength spectrum of the light wavelength conversion element; pulse current injection means for applying a pulse current to at least one region selected from the active region and the distributed Bragg reflection region; and pulse current control means for controlling the pulse current injection means on the basis of the higher harmonic output measured in the photo detector to change the oscillation wavelength of the semiconductor laser to a desired value at the inclined portion within the phase matching wavelength spectrum of the light wavelength conversion element.

According to this configuration, the photo detector measures the higher harmonic output of a laser beam emitted from the semiconductor laser and having undergone wavelength conversion in the light wavelength conversion element. Under this condition, firstly, the current control means controls the current injection means to adjust currents applied to the active region and the distributed Bragg reflection region, so that the oscillation wavelength of the semiconductor laser is fixed to the inclined portion within the phase matching wavelength spectrum. Subsequently, the pulse current injection means applies a pulse current to at least one region selected from the active region and the distributed Bragg reflection region. This instantaneously reduces a refractive index of the region to which the pulse current is applied, and the wavelength of the higher harmonic shifts to the shorter wavelength side, which causes the higher harmonic output to be reduced. In this instance, because the pulse current control means controls the extent to which the higher harmonic output is reduced, it is possible to change the higher harmonic output to a desired value continuously at high speeds.

(2) A coherent light source is the coherent light source set forth in (1), wherein the current control means stops the higher harmonic output by controlling the current injection means to stop applying a current to the active region.

When a current applied to the active region is stopped (reduced to 0), the fundamental wave emitted from the semiconductor laser is no longer outputted and reduced to 0. The higher harmonic output is reduced to 0 correspondingly. Hence, by stopping a current applied to the active region, it is possible to stop the higher harmonic output in a reliable manner.

(3) A coherent light source is the coherent light source set forth in (1), wherein the pulse current control means stops the higher harmonic output by controlling the pulse current injection means to apply pulse currents to the active region and the distributed Bragg reflection region.

When pulse currents are applied to the active region and the distributed Bragg reflection region, the refractive indexes of these regions are reduced instantaneously, and the wavelength of the higher harmonic shifts to the shorter wavelength side. This causes the wavelength of the higher harmonic to fluctuate to be outside the phase matching wavelength spectrum instantaneously, which can in turn stop the higher harmonic output.

(4) A coherent light source is the coherent light source set forth in (3), wherein the pulse current applied by the pulse current injection means has a pulse height sufficient for the pulse current to cause a wavelength of the higher harmonic to fluctuate to be outside the phase matching wavelength spectrum of the light wavelength conversion element.

According to this configuration, because the height of the pulse current is sufficiently large, it is possible to cause the wavelength of the higher harmonic to fluctuate to be outside the phase matching wavelength spectrum instantaneously by applying a pulse once, which can in turn stop the higher harmonic output.

(5) A coherent light source is the coherent light source set forth in (1) or (2), wherein when the higher harmonic output is stopped, a current applied to the distributed Bragg reflection region is adjusted.

According to this configuration, for example, when the higher harmonic output is stopped by stopping the application of a current to the active region, it is possible to obtain the higher harmonic output in a stable manner when the stopping of the higher harmonic output is released, by confirming and re-adjusting a current applied to the distributed Bragg reflection region.

(6) A coherent light source is the coherent light source set forth in any of (1) through (5), wherein when a high output state of the higher harmonic continues, the current control means controls the current injection means to adjust a current applied to at least one region selected from the active region and the distributed Bragg reflection region, so that a wavelength of the higher harmonic is maintained to be constant.

When the high output state of the higher harmonic continues, the temperature of the semiconductor laser is expected to rise. In this case, because the wavelength of a laser beam emitted from the semiconductor laser fluctuates, a current applied to one region, either the active region or the distributed Bragg reflection region, is adjusted to cancel out the change. This enables the higher harmonic output to be obtained in a stable manner even when the high output state of the higher harmonic continues.

(7) A coherent light source is the coherent light source set forth in (1), wherein: the semiconductor laser is further provided with a phase region; the current injection means applies a current also to the phase region; the current control means controls the current injection means on the basis of the higher harmonic output measured in the photo detector to change currents applied to the distributed Bragg reflection region and the phase region at a specific ratio, so that the oscillation wavelength of the semiconductor laser is fixed to the inclined portion within the phase matching wavelength spectrum of the light wavelength conversion element; and the pulse current injection means applies a pulse current to at least one region selected from the active region, the distributed Bragg reflection region, and the phase region.

According to this configuration, the photo detector measures the higher harmonic output of a laser beam emitted from the semiconductor laser and having undergone wavelength conversion in the light wavelength conversion element. Under this condition, firstly, the current control means controls the current injection-means to adjust currents applied to the active region, the distributed Bragg reflection region, and the phase region, so that the oscillation wavelength of the semiconductor laser is fixed to the inclined portion within the phase matching wavelength spectrum. In this instance, by changing currents applied to the distributed Bragg reflection region and the phase region at a specific ratio, it is possible to change the oscillation wavelength of the semiconductor laser continuously. Subsequently, the pulse current injection means applies a pulse current to at least one region selected from the active region, the distributed Bragg reflection region, and the phase region. This instantaneously reduces the refractive index of the region to which the pulse current is applied, and the wavelength of the higher harmonic shifts to the shorter wavelength side, which causes the higher harmonic output to be reduced. In this instance, because the pulse current control means controls the extent to which the higher harmonic output is reduced, it is possible to change the higher harmonic output to a desired value continuously at high speeds.

(8) A coherent light source is the coherent light source set forth in (7), wherein the current control means stops the higher harmonic output by controlling the current injection means to stop applying a current to the active region.

When a current applied to the active region is stopped (reduced to 0), the fundamental wave emitted from the semiconductor laser is no longer outputted and reduced to 0. The higher harmonic output is reduced to 0 correspondingly. Hence, by stopping a current applied to the active region, it is possible to stop the higher harmonic output in a reliable manner.

(9) A coherent light source is the coherent light source set forth in (7), wherein the pulse current control means stops the higher harmonic output by controlling the pulse current injection means to apply pulse currents to more than one region selected from the active region, the distributed Bragg reflection region, and the phase region.

When pulse currents are applied to the active region, the distributed Bragg reflection region, or the phase region, the refractive indexes of these regions are reduced instantaneously, and the wavelength of the higher harmonic shifts to the shorter wavelength side. This causes the wavelength of the higher harmonic instantaneously to fluctuate to be outside the phase matching wavelength spectrum, which can in turn stop the higher harmonic output.

(10) A coherent light source is the coherent light source set forth in (9), wherein the pulse current applied by the pulse current injection means has a pulse height sufficient for the pulse current to cause a wavelength of a higher harmonic to fluctuate to be outside the phase matching wavelength spectrum of the light wavelength conversion element.

According to this configuration, because the height of the pulse current is sufficiently large, it is possible to cause the wavelength of the higher harmonic to fluctuate to be outside the phase matching wavelength spectrum instantaneously by applying a pulse once, which can in turn stop the higher harmonic output.

(11) A coherent light source is the coherent light source set forth in (7) or (8), wherein when the higher harmonic output is stopped, a current applied to the distributed Bragg reflection region or the phase region is adjusted.

According to this configuration, for example, when the higher harmonic output is stopped by stopping the application of a current to the active region, it is possible to obtain the higher harmonic output in a stable manner when the stopping of the higher harmonic output is released, by confirming and re-adjusting currents applied to the distributed Bragg reflection region and the phase region.

(12) A coherent light source is the coherent light source set forth in any of (7) through (11), wherein when a high output state of the higher harmonic continues, the current control means controls the current injection means to adjust a current applied to at least one region selected from the active region, the distributed Bragg reflection region, and the phase region, so that a wavelength of the higher harmonic is maintained to be constant.

When a high output state of the higher harmonic continues, the temperature of the semiconductor laser is expected to rise. In this case, because the wavelength of a laser beam emitted from the semiconductor laser fluctuates, a current applied to at least one region selected from the active region, the distributed Bragg reflection region, and the phase region is adjusted to cancel out the change. This enables the higher harmonic output to be obtained in a stable manner even when a high output state of the higher harmonic continues.

(13) A coherent light source is the coherent light source set forth in any of (1) through (12), wherein the inclined portion within the phase matching wavelength spectrum is a portion where the higher harmonic output is in a range from 5% to 95%, both inclusive, of a peak output in the phase matching wavelength spectrum.

In the phase matching wavelength spectrum, a portion where the higher harmonic output is in a range from 5% to 95%, both inclusive, of the peak output changes almost linearly. Hence, gradation can be changed readily and continuously by fixing the oscillation wavelength of the semiconductor laser to this inclined portion.

(14) A coherent light source is the coherent light source set forth in (13), wherein the inclined portion within the phase matching wavelength spectrum is a portion on a shorter wavelength side in reference to a peak wavelength in the phase matching wavelength spectrum.

When the wavelength is fixed to a portion on the shorter wavelength side in reference to the peak wavelength, power consumption can be saved in comparison with a case where the wavelength is fixed to a portion on the longer wavelength side, because a current applied to the distributed Bragg reflection region can be smaller.

(15) A coherent light source is the coherent light source set forth in any of (1) through (14), wherein the current control means controls the current injection means to fix a current applied to the distributed Bragg reflection region to a point immediately after an occurrence of mode hopping of the oscillation wavelength of the semiconductor laser.

When a current applied to the distributed Bragg reflection region is fixed to a point in the vicinity where mode hopping of the oscillation wavelength of the semiconductor laser occurs, mode hopping readily occurs due to a change in temperature or the like, and the oscillation wavelength becomes unstable. Hence, the oscillation wavelength can be stabilized by being set to a point immediately after the occurrence of mode hopping.

(16) A coherent light source is the coherent light source set forth in any of (1) through (15), wherein a pulse current applied by the pulse current injection means is a rectangular pulse.

Because the rising portion of the pulse is sharp in a rectangular pulse, it is possible to reduce the higher harmonic output instantaneously by increasing carrier density in the semiconductor to which the rectangular pulse is applied.

(17) As has been described, a display device according to the present application is a display device that projects a laser beam having undergone intensity modulation according to an input video signal, which is characterized by comprising: a laser light source that emits a red laser beam; the coherent light source set forth in any of (1) through (16) that emits a blue laser beam; the coherent light source set forth in any of (1) through (16) that emits a green laser beam; multiplexing means for multiplexing the red, blue, and green laser beams to a single laser beam; first scanning means for scanning the multiplexed, single laser beam from the multiplexing means in a specific first direction; and second scanning means for scanning the laser beam scanned in the first direction in a second direction perpendicular to the first direction.

According to this configuration, because the coherent light sources that change the oscillation wavelength of the semiconductor laser instantaneously by applying a pulse current are used as light sources of blue and green laser beams, it is possible to achieve a display device capable of modulating the output at high speeds and obtaining continuous gradation.

(18) A display device is the display device set forth in (17), wherein the first scanning means and the second scanning means are a polygon mirror comprising a rotary polygon mirror and a galvanometer mirror that are combined selectively.

According to this configuration, there are two cases where, as the first scanning means, the polygon mirror is selected and the galvanometer mirror is selected. Likewise, there are two cases where, as the second scanning means, the polygon mirror is selected and the galvanometer mirror is selected. It is thus possible to choose an appropriate combination that suits the intended function.

(19) As has been described, a laser display according to the present application is a laser display, characterized by comprising: the display device set forth in (17) or (18); and a screen on which a laser beam is projected from the display device, wherein the input video signal is absent in an end portion of the screen, the current control means controls the current injection means to stop applying a current to the active region, and when an output from the semiconductor laser is stopped, the current control means adjusts a current applied to the distributed Bragg reflection region.

Normally, there is no input video signal in the end portion of the screen, and a region having no video output is present. Hence, when the current control means stops the output from the semiconductor laser, the current control means continues to adjust a current applied to the distributed Bragg reflection region using such a region. This includes, for example, confirmation and re-adjustment of a current applied to the distributed Bragg reflection region. It is thus possible to output a laser beam in a stable manner when the stopping of the output from the semiconductor laser is released.

(20) As has been described, a control method of a coherent light source according to the present application is characterized in that a photo detector detects a higher harmonic output from a light wavelength conversion element that is made of non-linear optical crystal and converts a wavelength of a laser beam emitted from a semiconductor laser, and currents applied to an active region and a distributed Bragg reflection region provided to the semiconductor laser are controlled on the basis of an output from the photo detector, so that the higher harmonic output detected in the photo detector is fixed to an inclined portion within a phase matching wavelength spectrum of the light wavelength conversion element, after which a pulse current is applied to the active region or the distributed Bragg reflection region for the higher harmonic output detected in the photo detector to be changed to a desired value at the inclined portion within the phase matching wavelength spectrum of the light wavelength conversion element.

The coherent light source using this control method is able to change the higher harmonic output to a desired value continuously at high speeds.

The coherent light source as described above can be also used chiefly in devices other than the display device described above, such as a drawing device, a measuring device, and an optical disc device.

While the invention has been described in detail, the descriptions are illustrative in all aspects, and have no intention to limit the invention. A number of modifications that are not described herein by way of example can be therefore anticipated without deviating from the scope of the invention.

This application is based on Japanese patent application serial No. 2004-54096, filed in Japan Patent Office on Feb. 27, 2004, the contents of which are hereby incorporated by reference.

Although the present invention has been fully described by way of example with reference to the accompanied drawings, it is to be understood that various changes and modifications will be apparent to those skilled in the art. Therefore, unless otherwise such changes and modifications depart from the scope of the present invention hereinafter defined, they should be construed as being included therein.

INDUSTRIAL APPLICABILITY

The coherent light source using the wavelength conversion element of the invention is able to modulate an SHG light source at high speeds, and is thereby useful, for example, as a light source of the display.

The invention claimed is:

1. A coherent light source comprising:
a semiconductor laser provided with an active region and a distributed Bragg reflection region;
a light wavelength conversion element that is made of non-linear optical crystal and converts a wavelength of a laser beam emitted from the semiconductor laser;
a photo detector that measures a higher harmonic output from the light wavelength conversion element;
current injection means for applying currents independently to the active region and the distributed Bragg reflection region;
current control means for controlling the current injection means on the basis of the higher harmonic output measured in the photo detector to fix an oscillation wavelength of the semiconductor laser to an inclined portion within a phase matching wavelength spectrum of the light wavelength conversion element;
pulse current injection means for applying a pulse current to at least one region selected from the active region and the distributed Bragg reflection region; and
pulse current control means for controlling the pulse current injection means on the basis of the higher harmonic output measured in the photo detector to change the oscillation wavelength of the semiconductor laser to a desired value at the inclined portion within the phase matching wavelength spectrum of the light wavelength conversion element and to change the higher harmonic output.

2. The coherent light source according to claim 1, wherein:
the current control means stops the higher harmonic output by controlling the current injection means to stop applying a current to the active region.

3. The coherent light source according to claim 1, wherein:
the pulse current control means stops the higher harmonic output by controlling the pulse current injection means to apply pulse currents to the active region and the distributed Bragg reflection region.

4. The coherent light source according to claim 3, wherein:
the pulse current applied by the pulse current injection means has a pulse height sufficient for the pulse current to cause a wavelength of the higher harmonic to fluctuate to be outside the phase matching wavelength spectrum of the light wavelength conversion element.

5. The coherent light source according to claim 1, wherein:
when the higher harmonic output is stopped, a current applied to the distributed Bragg reflection region is adjusted.

6. The coherent light source according to claim 1, wherein:
when a high output state of the higher harmonic continues, the current control means controls the current injection means to adjust a current applied to at least one region selected from the active region and the distributed Bragg reflection region, so that a wavelength of the higher harmonic is maintained to be constant.

7. The coherent light source according to claim 1, wherein:
the semiconductor laser is further provided with a phase region;
the current injection means applies a current also to the phase region;
the current control means controls the current injection means on the basis of the higher harmonic output measured in the photo detector to change currents applied to the distributed Bragg reflection region and the phase region at a specific ratio, so that the oscillation wavelength of the semiconductor laser is fixed to the inclined portion within the phase matching wavelength spectrum of the light wavelength conversion element; and
the pulse current injection means applies a pulse current to at least one region selected from the active region, the distributed Bragg reflection region, and the phase region.

8. The coherent light source according to claim 7, wherein:
the current control means stops the higher harmonic output by controlling the current injection means to stop applying a current to the active region.

9. The coherent light source according to claim 7, wherein:
the pulse current control means stops the higher harmonic output by controlling the pulse current injection means to apply pulse currents to more than one region selected from the active region, the distributed Bragg reflection region, and the phase region.

10. The coherent light source according to claim 9, wherein:
the pulse current applied by the pulse current injection means has a pulse height sufficient for the pulse current to cause a wavelength of the higher harmonic to fluctuate to be outside the phase matching wavelength spectrum of the light wavelength conversion element.

11. The coherent light source according to claim 7, wherein:
when the higher harmonic output is stopped, a current applied to the distributed Bragg reflection region or the phase region is adjusted.

12. The coherent light source according to claim 7, wherein:
when a high output state of the higher harmonic continues, the current control means controls the current injection means to adjust a current applied to at least one region selected from the active region, the distributed Bragg reflection region, and the phase region, so that a wavelength of the higher harmonic is maintained to be constant.

13. The coherent light source according to claim 1, wherein:
the inclined portion within the phase matching wavelength spectrum is a portion where the higher harmonic output is in a range from 5% to 95%, both inclusive, of a peak output in the phase matching wavelength spectrum.

14. The coherent light source according to claim 13, wherein:
the inclined portion within the phase matching wavelength spectrum is a portion on a shorter wavelength side in reference to a peak wavelength in the phase matching wavelength spectrum.

15. The coherent light source according to claim 1, wherein:
the current control means controls the current injection means to fix a current applied to the distributed Bragg reflection region to a point immediately after an occurrence of mode hopping of the oscillation wavelength of the semiconductor laser.

16. The coherent light source according to claim 1, wherein:
a pulse current applied by the pulse current injection means is a rectangular pulse.

17. A display device that projects a laser beam having undergone intensity modulation according to an input video signal, the display device comprising:
a laser light source that emits a red laser beam;
the coherent light source according to claim 1 that emits a blue laser beam;
the coherent light source according to claim 1 that emits a green laser beam;
multiplexing means for multiplexing the red, blue, and green laser beams to a single laser beam;
first scanning means for scanning the multiplexed, single laser beam from the multiplexing means in a specific first direction; and
second scanning means for scanning the laser beam scanned in the first direction in a second direction perpendicular to the first direction.

18. The display device according to claim 17, wherein:
the first scanning means and the second scanning means are a polygon mirror comprising a rotary polygon mirror and a galvanometer mirror that are combined selectively.

19. A laser display comprising:
the display device according to claim 17; and
a screen on which a laser beam is projected from the display device, wherein:
the input video signal is absent in an end portion of the screen, the current control means controls the current injection means to stop applying a current to the active region, and when an output from the semiconductor laser is stopped, the current control means adjusts a current applied to the distributed Bragg reflection region.

20. A control method of a coherent light source, said method comprising:
converting, with a light wavelength conversion element that is made of non-linear optical crystal, a wavelength of a laser beam emitted from a semiconductor laser provided with an active region and a distributed Bragg reflection region;
measuring, with a photo detector, a higher harmonic output from the light wavelength conversion element;
applying currents independently to the active region and the distributed Bragg reflection region;
controlling the currents on the basis of the higher harmonic output measured in the photo detector to fix an oscillation wavelength of the semiconductor laser to an inclined portion within a phase matching wavelength spectrum of the light wavelength conversion element;
applying a pulse current to at least one region selected from the active region and the distributed Bragg reflection region; and
controlling the applying of the pulse current on the basis of the higher harmonic output measured in the photo detector to change the oscillation wavelength of the semiconductor laser to a desired value at the inclined portion within the phase matching wavelength spectrum of the light wavelength conversion element and to change the higher harmonic output.

* * * * *